(12) United States Patent
Cui et al.

(10) Patent No.: US 10,541,287 B2
(45) Date of Patent: Jan. 21, 2020

(54) DISPLAY SUBSTRATE WITH UNIFORM GATE INSULATION STRUCTURE

(71) Applicants: Beijing BOE Display Technology Co., Ltd., Beijing (CN); BOE TECHNOLOGY GROUP CO., LTD., Beijing (CN)

(72) Inventors: Ning Cui, Beijing (CN); Jiazuo Sai, Beijing (CN); Yanqiu Li, Beijing (CN); Juan Yu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/051,259

(22) Filed: Jul. 31, 2018

(65) Prior Publication Data

US 2019/0131366 A1    May 2, 2019

(30) Foreign Application Priority Data

Oct. 27, 2017  (CN) ........................ 2017 1 1027586

(51) Int. Cl.
*H01L 27/32* (2006.01)
*H01L 27/088* (2006.01)
*H01L 27/12* (2006.01)

(52) U.S. Cl.
CPC ........ *H01L 27/3248* (2013.01); *H01L 27/088* (2013.01); *H01L 27/1203* (2013.01); *H01L 27/1218* (2013.01)

(58) Field of Classification Search
CPC ............... H01L 27/3248; H01L 27/088; H01L 27/1203; H01L 27/1218
See application file for complete search history.

(56) References Cited

U.S. PATENT DOCUMENTS

| 2003/0034523 A1* | 2/2003 | Hiroshima | .......... H01L 21/2026 257/347 |
| 2004/0113142 A1* | 6/2004 | Ishikawa | ............. G02F 1/13454 257/13 |

(Continued)

FOREIGN PATENT DOCUMENTS

| CN | 1825548 A | 8/2006 |
| CN | 104183648 A | 12/2014 |

OTHER PUBLICATIONS

Chinese Office Action dated Jul. 29, 2019, from application No. 201711027586.0.

*Primary Examiner* — Allen L Parker
*Assistant Examiner* — Gustavo G Ramallo
(74) *Attorney, Agent, or Firm* — Foley & Lardner LLP

(57) ABSTRACT

The present disclosure provides a display substrate, a manufacturing method thereof, a display panel, and a display device. The display substrate includes: a substrate; and a thin film transistor, provided on a first surface of the substrate and including an electrode and an insulating layer, the insulating layer covering the electrode, wherein a groove is formed on a surface of the insulating layer away from the electrode, and an orthogonal projection of a bottom wall of the groove on the substrate overlaps with an orthogonal projection of the electrode on the substrate. In the display substrate provided by the present disclosure, a surface of the insulating layer covering the electrode away from the substrate is planarized, so that the subsequently formed layer structures may have better flatness, and problems of faulting, fracturing and so on likely occurring when the display substrate is bent may be solved.

13 Claims, 4 Drawing Sheets

(56) References Cited

U.S. PATENT DOCUMENTS

| | | | | |
|---|---|---|---|---|
| 2004/0113161 A1* | 6/2004 | Suzuki | ............... | H01L 29/4908 |
| | | | | 257/83 |
| 2007/0295960 A1* | 12/2007 | Moriya | ............... | H01L 27/3274 |
| | | | | 257/40 |
| 2009/0251047 A1* | 10/2009 | Lee | ..................... | H01L 27/1214 |
| | | | | 313/504 |
| 2016/0276374 A1 | 9/2016 | Nodera et al. | | |

\* cited by examiner

DISPLAY SUBSTRATE WITH UNIFORM GATE INSULATION STRUCTURE

CROSS REFERENCE TO RELATED APPLICATIONS

This application claims the benefit of China Patent Application No. 201711027586.0 filed with the China Patent Office on Oct. 27, 2017, the entire content of which is hereby incorporated by reference.

TECHNICAL FIELD

The present disclosure relates to the field of display technology, and in particular, to a display substrate, a manufacturing method thereof, a display panel and a display device.

BACKGROUND

Flexible display technology is an emerging technology that has developed in recent years and is represented by organic light-emitting diode (OLED) display technology. Compared with traditional liquid crystal display, the OLED technology has good flexibility, and its process conditions can meet requirements of flexible substrates. With vigorous development of the flexible display, a series of flexible materials get people's attention, representative thereof including: organic materials, polythiophene materials, liquid metals, carbon-based flexible materials.

In the current liquid crystal display technology, generally, sputtering is performed on one side of a substrate to form a gate electrode firstly, and then a layer of gate insulating layer with a uniform thickness is deposited. This causes a gate insulating layer to have a step structure (the height difference thereof being from 300 nanometers to 500 nanometers, 300-500 nm for short) at a position corresponding to the gate electrode, therefore, the flatness of subsequently deposited layer structures is not good, and these overlarge height differences make the flexible display substrate prone to metal wiring fracturing, film layer faulting and the like.

Therefore, at this stage, a structural design of flexible display technology still needs improvement.

SUMMARY

The present disclosure aims to solve one of the technical problems in the related art at least to some extent.

The present disclosure was completed based on following findings of the applicant.

In the course of research, the present applicant discovered that an existing bottom gate structure has a step structure with a height of 300 nm to 500 nm, therefore making subsequent layers (a gate insulating layer, a source/drain electrode, and a protective layer, etc.) have poor flatness. Therefore, problems such as fracturing of metal wiring, faulting of film layer, rubbing mura and so on are likely to occur during the bending. In view of the above technical problems, the applicant of the present application planarizes a surface of an insulating layer covering the electrode away from the substrate, so that subsequently formed layer structures have better flatness, therefore solving the problem of fracturing, faulting and the like occurring during the bending of the display substrate.

In view of above, an object of the present disclosure is to provide a display substrate that is more flexible, prevents fracturing or faulting.

In some arrangements, the present disclosure provides a display substrate.

According to an arrangement of the present disclosure, the display substrate includes a substrate and a thin film transistor, provided on a first surface of the substrate and including an electrode and an insulating layer, the insulating layer covering the electrode, a groove is formed on a surface of the insulating layer away from the electrode, and an orthogonal projection of a bottom wall of the groove on the substrate overlaps with an orthogonal projection of the electrode on the substrate.

The applicant has unexpectedly found that, in the display substrate provided by the present disclosure, a surface of the insulating layer covering the electrode away from the substrate is planarized, so that the subsequently formed layer structures may have better flatness, and problems of faulting, fracturing and so on likely occurring when the display substrate is bent may be solved.

In addition, the display substrate according to the above arrangement of the present disclosure may further have following additional technical features.

According to an arrangement of the present disclosure, the groove has a depth not exceeding 200 nm.

According to an arrangement of the present disclosure, the substrate is a flexible substrate.

According to an arrangement of the present disclosure, the insulating layer includes: a first insulating layer, a trench is provided on the first insulating layer, the electrode is provided in the trench, and the electrode has a height not greater than a depth of the trench, and a second insulating layer, provided on a side of the first insulating layer away from the substrate and covering the electrode and the first insulating layer, the groove is formed on a surface of the second insulating layer away from the first insulating layer.

According to an arrangement of the present disclosure, the electrode has a material including a liquid metal.

According to an arrangement of the present disclosure, the liquid metal includes at least one selected from a copper aluminum alloy, a copper silver alloy, a gallium indium tin alloy and an indium bismuth alloy.

According to an arrangement of the present disclosure, the electrode is a gate electrode provided on the first surface of the substrate, and the insulating layer is a gate insulating layer including: a first gate insulating layer, provided on the first surface of the substrate and having a first trench, the gate electrode is provided in the first trench, and the gate electrode has a height not greater than a depth of the first groove, and a second gate insulating layer, covering the gate electrode and the first gate insulating layer, the groove is formed on a surface of the second gate insulating layer away from the first gate insulating layer.

According to an arrangement of the present disclosure, the electrode is a source electrode and a drain electrode, and the insulating layer is a protective layer including: a first protective layer, having a second trench and a third trench, a spacer is provided between the second trench and the third trench, the source electrode is provided in the second trench, the drain electrode is provided in the third trench, and the source electrode has a height not greater than a depth of the second trench, and the drain electrode has a height not greater than a depth of the third trench, and a second protective layer, covering the source electrode, the drain electrode and the first protective layer, the groove is formed on a surface of the second protective layer away from the first protective layer.

In some arrangements, the present disclosure provides a method of manufacturing a display substrate.

According to an arrangement of the present disclosure, the method includes: providing a substrate, forming a thin film transistor on a first surface of the substrate, forming the thin film transistor includes: forming a first insulating layer having a trench, filling a liquid metal in the trench to form an electrode, forming a second insulating layer on a side of the electrode and the first insulating layer away from the substrate, a groove is formed on a surface of the second insulating layer away from the first insulating layer, and an orthogonal projection of a bottom wall of the groove on the substrate overlaps with an orthogonal projection of the electrode on the substrate.

The applicant has unexpectedly found that by using the manufacturing method of the arrangements of the present disclosure, a liquid metal is filled in the trench, and thus an electrode wiring having excellent flexibility and preventing fracturing may be obtained. Further, a low-temperature forming process of the electrode wiring may be realized, and then the production yield of the display substrate can be improved, and a display substrate having a film layer of excellent flatness and preventing fracturing can be obtained.

In addition, according to the manufacturing method of the above arrangement of the present disclosure, it may further have following additional technical features.

According to an arrangement of the present disclosure, the groove has a depth not exceeding 200 nm.

According to an arrangement of the present disclosure, the liquid metal has a filling level not greater than a depth of the trench.

According to an arrangement of the present disclosure, forming the thin film transistor further includes: forming a first gate insulating layer on the first surface of the substrate, a first trench is formed on the first gate insulating layer, filling a liquid metal in the first trench to form a gate electrode, the gate electrode has a height not greater than a depth of the first trench, forming a second gate insulating layer on a side of the gate electrode and the first gate insulating layer away from the substrate, the groove is formed on a surface of the second gate insulating layer away from the first gate insulating layer.

According to an arrangement of the present disclosure, forming the thin film transistor further includes: forming a first protective layer, a second trench and a third trench provided with a spacer therebetween are formed on the first protective layer, filling a liquid metal in the second trench and the third trench to form a source electrode and a drain electrode respectively, the source electrode and the drain electrode have heights not greater than depths of the second trench and the third trench respectively, and forming a second protective layer on a side of the source electrode, the drain electrode and the first protective layer away from the substrate, the groove is formed on a surface of the second protective layer away from the first protective layer.

In some arrangements, the present disclosure provides a display panel.

According to an arrangement of the present disclosure, the display panel includes the display substrate described above.

The applicant has unexpectedly found that, the display panel of the arrangement of the present disclosure has a display substrate with good anti-fracturing and anti-faulting performance, so that the display panel is excellent in bending resistance. Those skilled in the art can understand that the features and advantages described above with respect to the display substrate are still applicable to the display panel, and will not be repeated herein.

In some arrangements, the present disclosure provides a display device.

According to an arrangement of the present disclosure, the display device includes the above display panel.

The applicant has unexpectedly found that, in the display device of the arrangement of the present disclosure, the display panel has excellent bending resistance performance, so that the flexible display effect of the display device is better. Those skilled in the art can understand that, the features and advantages described above with respect to the display substrate and the display panel are still applicable to the display device, which will not be repeated herein.

Additional arrangements and advantages of the present disclosure will be set forth in part in the following description, and in part will be obvious from the following description, or may be learned by practice of the present disclosure.

BRIEF DESCRIPTION OF THE DRAWINGS

The above and/or additional arrangements and advantages of the present disclosure will become apparent and easily understood from the following description of arrangements in conjunction with the accompanying drawings, in which.

Figure 1:
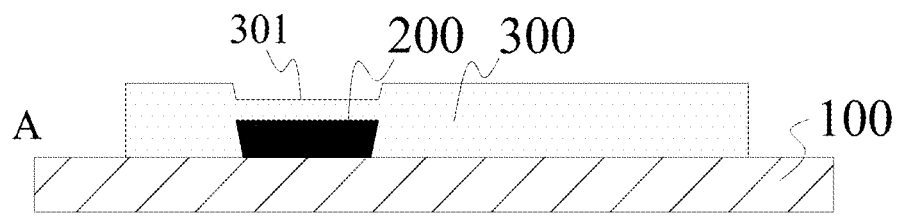
FIG. 1 is a cross-sectional schematic view of a display substrate according to an arrangement of the present disclosure.

REFERENCE NUMERALS 100 substrate
200 electrode
210 gate electrode
220 source electrode
230 drain electrode
300 insulating layer 301 groove
3011 first groove
310 first insulating layer
3101 trench
311 first gate insulating layer
3111 first trench
312 first protective layer
3122 second trench
3123 third trench
320 second insulating layer
321 second gate insulating layer
322 second protective layer
400 active layer
500 pixel electrode
600 common electrode

DETAILED DESCRIPTION

The following describes the arrangements of the present disclosure in detail. Those skilled in the art will understand that, the following arrangements are intended to explain the present disclosure and should not be construed as limiting the present disclosure. Unless otherwise specified, as for specific techniques or conditions not explicitly described in the following examples, those skilled in the art can perform according to commonly used technologies or conditions in the art or according to product specifications.

In some arrangements, the present disclosure provides a display substrate. Referring to FIGS. 1 to 5, the display substrate of the present disclosure will be described in detail.

According to an arrangement of the present disclosure, referring to FIG. 1, the display substrate includes a substrate 100 and a thin film transistor (TFT), provided on a first surface A of the substrate 100 and including an electrode 200 and an insulating layer 300, the insulating layer 300 covers the electrode 200, a groove 301 is formed on a surface of the insulating layer 300 away from the electrode 200, and an orthogonal projection of a bottom wall of the groove 301 on the substrate 100 overlaps with an orthogonal projection of the electrode 200 on the substrate 100. In this way, a surface of the insulating layer 300 away from the substrate 200 is planarized, so that the subsequently formed layer structures may have better flatness, and problems of faulting, fracturing and so on likely occurring when the display substrate is bent may be solved.

According to the arrangement of the present disclosure, a specific depth of the groove 301 is not particularly limited, as long as the groove 301 with this depth does not affect the flatness of the insulating layer 300. A person skilled in the art can adjust a specific relationship between a height h of the electrode 200 and a depth H of the groove 3101, to obtain a groove 301 with a certain depth. In some arrangements of the present disclosure, the depth of the groove 301 may not exceed 200 nm. It should be noted that, all "depth of the groove not exceeding 200 nm" in the present description specifically means that the depth of the groove is 0~200 nm. In this way, a height difference of the insulating layer 300 away from an upper surface of the electrode 200 can be no more than 200 nm, so that subsequently formed layer structures can have better flatness, therefore further solving problems of faulting, fracturing and so on that likely occur when the display substrate is bent. Besides, a smaller height difference facilitates the coating of other structures, such as a liquid crystal alignment layer (such as Polyimide, PI for short), therefore forming a flat alignment layer, reducing the occurrence of defects such as rubbing mura, and further improving the display quality of the display panel.

According to the arrangement of the present disclosure, a specific type of the substrate 100 is not particularly limited, and all substrates of common types in the field may be applicable. Those skilled in the art may select correspondingly according to specific use of the display substrate. In some arrangements of the present disclosure, the substrate 100 may be a flexible substrate, so that the flexibility of the display substrate may be better.

Figure 2:
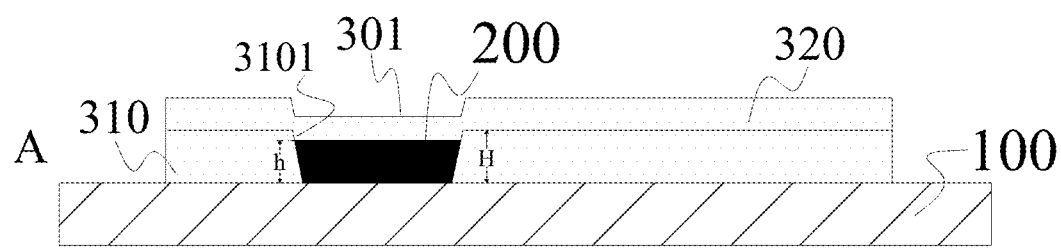
FIG. 2 is a cross-sectional schematic view of a display substrate according to arrangement of the present disclosure.

According to an arrangement of the present disclosure, referring to FIG. 2, an insulating layer 300 (not shown in the figure) may include a first insulating layer 310 and a second insulating layer 320. In the arrangement, a trench 3101 is provided on the first insulating layer 310, the electrode 200 is provided in the trench 3101, and the electrode 200 has a height h not greater than a depth H of the trench 3101. A second insulating layer 320 is provided on a side of the first insulating layer 310 away from the substrate 100 and covering the electrode 200 and the first insulating layer 310, and then the groove 301 is formed on a surface of the second insulating layer 320 away from the electrode 200. In this way, providing the electrode 200 in the trench 3101 of the first insulating layer 310 can make the surface of the second insulating layer 320 flatter.

According to the arrangement of the present disclosure, the specific material of the electrode 200 is not particularly limited, and those skilled in the art can select correspondingly according to the specific flexibility requirement of the display substrate. In some arrangements of the present disclosure, the electrode 200 may be formed by filling the trench 3101 with a liquid metal. Thus, the electrode 200 formed of the liquid metal has better flexibility, and a low-temperature molding process of the electrode 200 may also be realized. As a result, the production yield of the display substrate can be improved, and an anti-fracturing display substrate with good flexibility can be obtained.

The applicant of the present disclosure has found that, the liquid metal refers to an amorphous metal, which is a mixture of positive ion fluid and free electron gas, and has a non-crystalline molecular structure. The liquid metal can also be understood as an amorphous mixture of various metal elements according to a certain proportion when the cooling rate is quite high. The liquid metals can be divided into three types: metals that exist in liquid state under normal pressure, amorphous alloys, and liquid metals of mimic alloys. Metals that are liquid at 200° C. under normal pressure have a liquid form, and it follows that the electrode 200 formed by the liquid metals have better flexibility. Moreover, a melting point of the liquid metal is also relatively low, and the liquid metal can also realize the preparation of the electrode 200 under a low temperature process compared with a 800 to 1000° C. high temperature process of sputtering. Therefore, the applicant replaces an original metal material (such as copper, aluminum, etc.) of the electrode wiring with the liquid metal, an anti-fracturing display substrate with better flexibility can be obtained.

According to the arrangement of the present disclosure, the specific type of the liquid metal is not particularly limited, and those skilled in the art can select correspondingly according to specific flexibility requirements of the electrode 200. In some arrangements of the present disclosure, the liquid metal forming the electrode 200 may include at least one selected from a copper aluminum alloy, a copper silver alloy, a gallium indium tin alloy and an indium bismuth alloy. In this way, liquid metals of the above types may be used to form the electrode 200 at room temperature, and the flexibility of the electrode 200 is better.

According to the arrangement of the present disclosure, the specific type of the electrode 200 is not particularly limited either, and all types of electrodes commonly used in the field, for example, a gate electrode, a source/drain electrode or the like may be applicable. Those skilled in the art can select correspondingly according to specific design of the display substrate.

In some arrangements of the present disclosure, the electrode 200 may be a gate electrode and the insulating layer 300 may be a gate insulating layer. In the arrangement, referring to FIG. 3, the gate electrode 210 may be provided on the first surface A of the substrate 100 and the gate insulating layer includes a first gate insulating layer 311 and a second gate insulating layer 321. Besides, the first gate insulating layer 311 is provided on the first surface A of the substrate 100 and has a first trench 3111. The gate electrode 210 is provided in the first trench 3111, and the gate electrode 210 has a height $h_1$ not greater than a depth $H_1$ of the first trench 3111. The second gate insulating layer 321 covers the gate electrode 210 and the first gate insulating layer 311, a first groove 3011 is formed on a surface of the second gate insulating layer 321 away from the gate electrode 210. In this way, by filling the trench with the liquid metal, the low-temperature forming process of the gate electrode 210 can be realized, and the formation of a flat gate insulating layer structure is facilitated, and the faulting of the display substrate is less likely to occur.

According to the arrangement of the present disclosure, a specific depth of the first groove 3011 is not particularly limited, as long as the depth of the groove is between 0 to 200 nm. Those skilled in the art can adjust a specific relationship between the height $h_1$ of the gate electrode 210 and the depth $H_1$ of the first trench 3011, to obtain the first trench 3111 of a certain depth, which will not be repeated herein.

In other arrangements of the present disclosure, the electrode 200 may be a source electrode and a drain electrode, and the insulating layer 300 may be a protective layer. In the arrangement, the protective layer includes: a first protective layer 312 and a second protective layer 322. The first protective layer 312 has a second trench 3122 and a third trench 3123. A spacer is provided between the second trench 3122 and the third trench 3123, the source electrode 220 is provided in the second trench 3122, the drain electrode 230 is provided in the third trench 3123, and the source electrode 220 has a height $h_2$ not greater than a depth $H_2$ of the second trench 3122, and the drain electrode 230 has a height $h_2$ not greater than a depth $H_2$ of the third trench 3123. The second protective layer 322 covers the source electrode 220, the drain electrode 230 and the first protective layer 312, a second groove is formed on a surface of the second protective layer 322 away from the first protective layer 312. In this way, by filling the trench with the liquid metal, the low-temperature forming process of the source electrode 220 and the drain electrode 230 can be realized, and the formation of a flat proactive layer structure is facilitated, and the faulting of the display substrate is less likely to occur. Besides, an interval structure between the second trench 3122 and the third trench 3123 pre-formed before filling the trench can separate the source electrode 220 and the drain electrode 230, which facilitates reducing a leakage current of the TFT. In some specific examples, referring to FIG. 4, the source electrode 220 and the drain electrode 230 may be disposed on a side of the second gate insulating layer 321 away from the gate electrode 210, and the first protective layer 312 may be disposed on a side of the second gate insulating layer 321 away from the first gate insulating layer 311. In this way, an improved thin film transistor structure can be obtained.

According to an arrangement of the present disclosure, a specific depth of the second groove is not particularly limited either, as long as the depth of the groove is between 0 and 200 nm, and those skilled in the art can adjust a specific relationship between the height $h_2$ of the source electrode 220, the drain electrode 230 and the depth $H_2$ of the second trench 3122, the third trench 3123, to obtain a second groove with a certain depth. In some arrangements of the present disclosure, referring to FIG. 4, the depth of the second groove of the second protective layer 322 away from the surface of the first protective layer 312 may be 0 nm, so that a protective layer structure with a completely flat upper surface can be obtained, which is beneficial to the flatness of subsequently formed layer structures.

Figure 5:
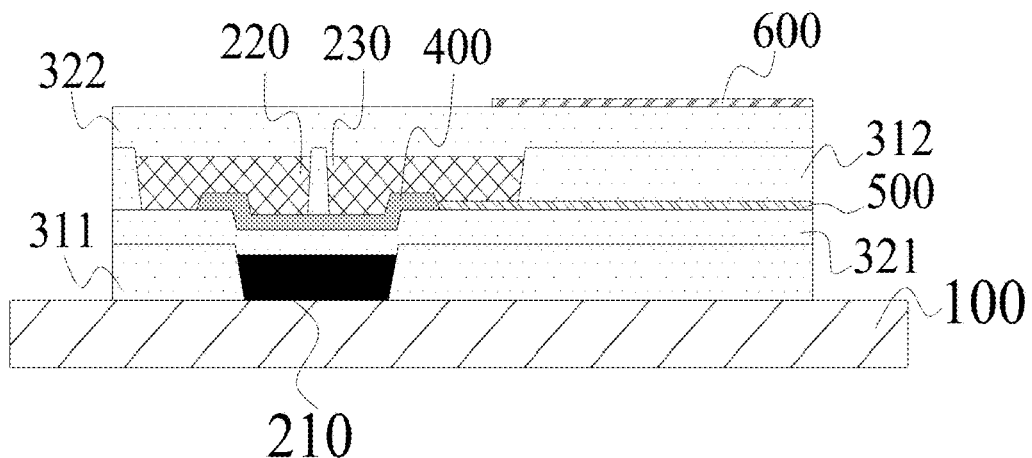
FIG. 5 is a cross-sectional schematic view of a display substrate according to another arrangement of the present disclosure.

According to an arrangement of the present disclosure, referring to FIG. 5, the display substrate may further include an active layer 400, a pixel electrode 500, and a common electrode 600. In the arrangement, the active layer 400 may be disposed between the second gate insulating layer 321 and the source electrode 220, the drain electrode 230, the pixel electrode 500 may be disposed between the drain electrode 230, the first protective layer 312 and the second gate insulating layer 321, and the common electrode 600 may be disposed on a side of the second protective layer away from the pixel electrode 500. In this way, a display substrate with improved structure and function can be obtained.

According to the arrangement of the present disclosure, the specific material of the substrate 100 is not particularly limited, and all the materials of the substrate commonly used in the field may be applicable, for example, a resin material such as polyimide. The person skilled in the art can select correspondingly according to specific flexibility requirements of the display substrate, which will not be repeated herein.

According to an arrangement of the present disclosure, specific materials of each dielectric layer (including the first gate insulating layer 311, the second gate insulating layer 321, the first protective layer 312, and the second protective layer 322) are not particularly limited either. All commonly used flexible dielectric materials in the field may be applicable, for example, silicon nitride (SiNx), etc., and those skilled in the art may select correspondingly according to specific flexibility requirements of the display substrate, which will not be repeated herein.

According to the arrangement of the present disclosure, the specific material of the active layer 400 is not particularly limited either, and all flexible semiconductor materials commonly used in the field may be applicable, for example, an amorphous silicon material, or the like. Those skilled in the art may select correspondingly according to specific flexibility requirements and specific semiconductor characteristic requirements of the thin film transistor, which will not be repeated herein.

According to the arrangement of the present disclosure, specific materials of the pixel electrode 500 and the common electrode 600 are not particularly limited either, and all flexible electrode materials commonly used in the field may be applicable, for example, indium tin oxide (ITO), or the like. Those skilled in the art may select correspondingly according to specific flexibility requirements and specific electrical property requirements of the thin film transistor, which will not be repeated herein.

To sum up, according to an arrangement of the present disclosure, the present disclosure provides a display substrate, in which a surface of the insulating layer covering the electrode away from the substrate is planarized, so that the subsequently formed layer structures may have better flatness, and problems of faulting, fracturing and so on likely occurring when the display substrate is bent may be solved.

Figure 6:
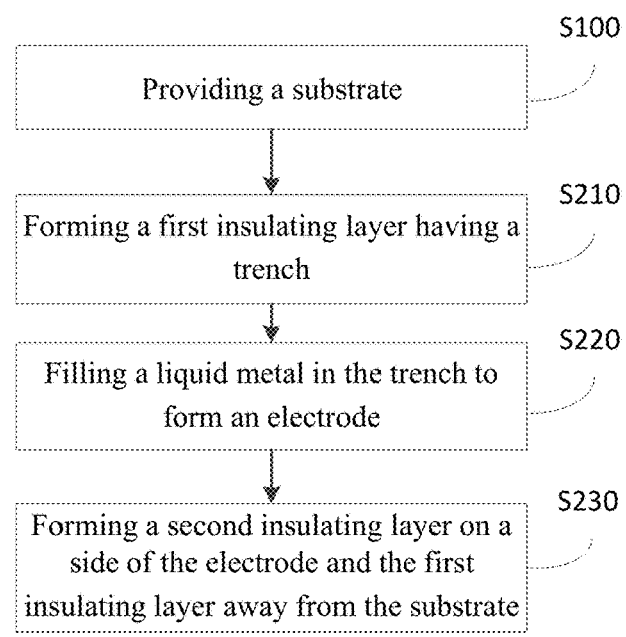
FIG. 6 is a schematic flowchart of a method of manufacturing a display substrate according to an arrangement of the present disclosure.

In some arrangements, the present disclosure proposes a method of manufacturing a display substrate. The manufacturing method of the present disclosure will be described in detail with reference to FIGS. 2 to 12. Referring to FIG. 6, according to an arrangement of the present disclosure, at S100, a substrate is provided.

In S100, a substrate 100 is provided as a flat substrate for subsequently forming a flat thin film transistor structure. In some arrangements of the present disclosure, the substrate 100 may be a flexible substrate, and a back plate may be fixed on a second surface of the flexible substrate 100 opposite to the first surface in advance. Thus, the back plate non liable to be deformed is beneficial to form a flatter thin film transistor structure on the first surface of the substrate 100, thus preventing the flexibility of the substrate from affecting the flatness of the thin film transistor structure.

S200: a thin film transistor is formed on a first surface of the substrate.

In S200, a thin film transistor is formed on the first surface A of the substrate 100. According to the arrangement of the present disclosure, those skilled in the art can design specific methods of forming the thin film transistor according to the specific structure of the thin film transistor. In some arrangements of the present disclosure, S200 of forming a thin film transistor may include S210: a first insulating layer having a trench is formed.

In S210, a first insulating layer 310 having a trench 3101 is formed. As such, the trench 3101 for filling the liquid metal may be formed on the first insulating layer 310.

According to arrangements of the present disclosure, the specific method of forming the first insulating layer 310 and the trench 3101 is not particularly limited, and those skilled in the art can select correspondingly according to the specific material of the first insulating layer 310. In some arrangements of the present disclosure, a first insulating layer 310 of SiNx material may be deposited integrally to have a thickness greater than a preset thickness of the electrode 200, and then an exposure using a mask and a photoresist, development, and other processes are performed to form the trench 3101 of the desired electrode wiring pattern. In this way, while ensuring the flatness of the first insulating layer 310, a trench 3101 with a more accurate pattern is formed.

Figure 7:
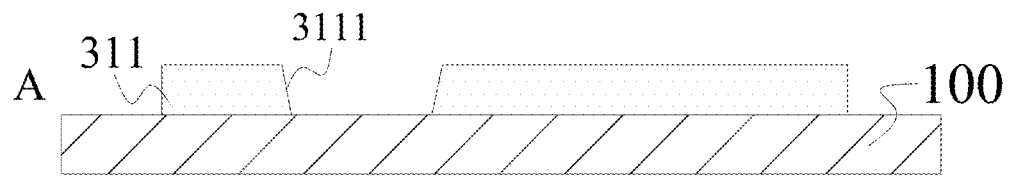
FIG. 7 is a schematic sectional view of a product of S210 of a manufacturing method according to an arrangement of the present disclosure.

In some arrangements of the present disclosure, referring to FIG. 7, a first gate insulating layer 311 may be formed on the first surface A of the substrate 100, and the first gate insulating layer 311 is formed with a first trench 3111. Thus, a first trench 3101 for forming a gate electrode may be formed on the first gate insulating layer 311. In other arrangements of the present disclosure, referring to FIG. 10, a first protective layer 312 may be formed, and the first protective layer 312 is formed with second trenches 3122 and third trenches 3123 disposed with a spacer therebetween. In the arrangement, the interval structure between the second trench 3122 and the third trench 2123 can be used as a back channel structure of the thin film transistor. In this way, the second trench 3122 and the third trench 3123 for forming a source electrode and a drain electrode respectively may be formed on the first protective layer 312.

S220: a liquid metal is filled in the trench to form an electrode.

In S220, the liquid metal is filled in the trench 3101 formed in S210, and thus, the electrode 200 formed of the liquid metal can be formed at a low temperature (below 200 degrees Celsius).

According to the arrangement of the present disclosure, specific process conditions for filling are not particularly limited, and those skilled in the art can select and adjust correspondingly according to the specific type of the liquid metal. In some arrangements of the present disclosure, the liquid metal may include at least one selected from a copper aluminum alloy, a copper silver alloy, a gallium indium tin alloy and an indium bismuth alloy, and the filling process of the electrode 200 at room temperature (below 100 degrees Celsius) can be realized. Therefore, it may avoid the influence of high temperature on the structure of the thin film transistor, further improve the production yield of the display substrate, and obtain an anti-fracturing display substrate with good flexibility.

Figure 8:
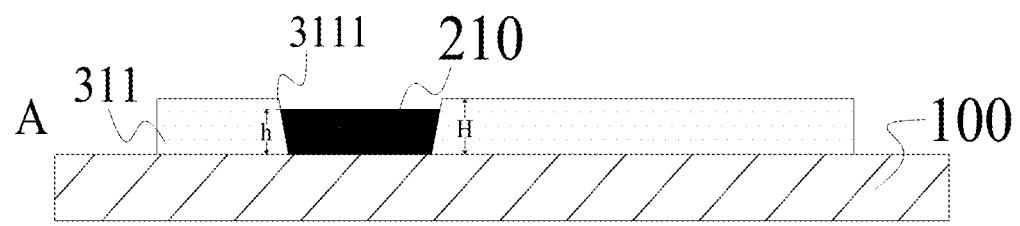
FIG. 8 is a schematic sectional view of a product of S220 of a manufacturing method according to an arrangement of the present disclosure.
Figure 9:
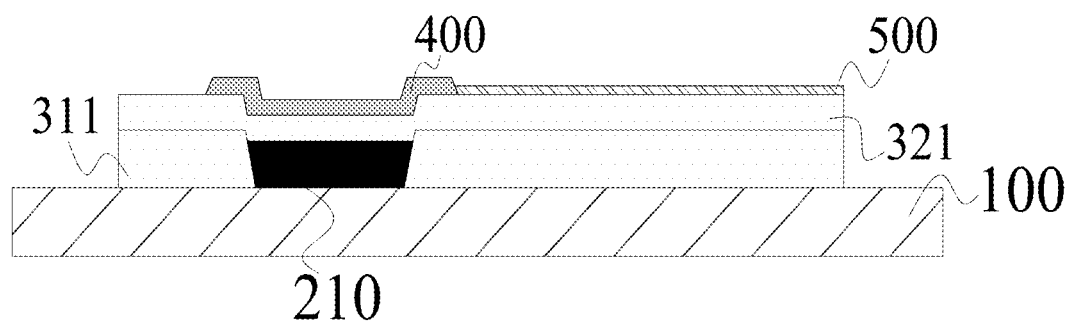
FIG. 9 is a schematic sectional view of a product after S230 of a manufacturing method according to an arrangement of the present disclosure.
Figure 10:
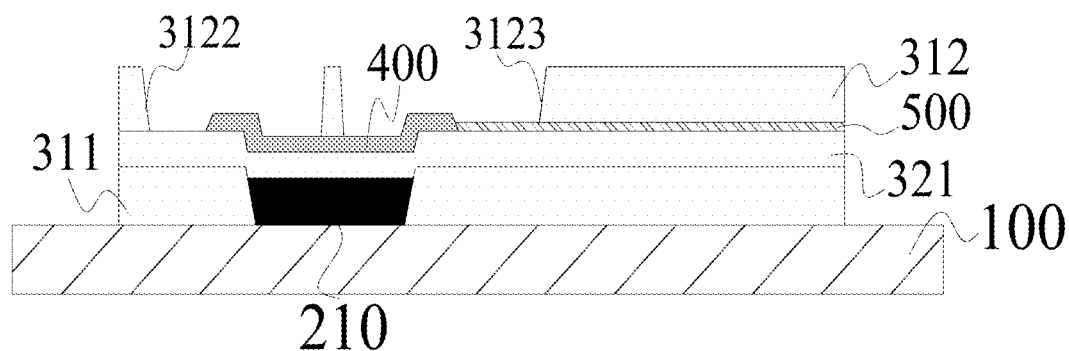
FIG. 10 is a schematic sectional view of a product of S210 of a manufacturing method according to another arrangement of the present disclosure.
Figure 11:
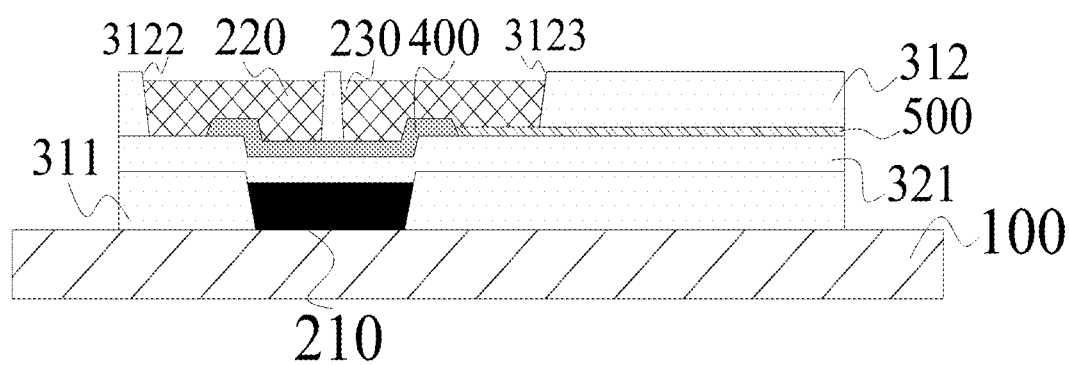
FIG. 11 is a schematic sectional view of a product of S220 of a manufacturing method according to another arrangement of the present disclosure.

According to an arrangement of the present disclosure, referring to FIG. 8, the filling height h of the liquid metal may be not greater than the depth H of the trench, and thus, the liquid metal in a liquid state may be prevented from overflowing during the filling. In some arrangements of the present disclosure, referring to FIG. 8, a liquid metal is filled in the first trench 3111 to form the gate electrode 210, and the height of the gate electrode 210 is not greater than the depth of the first trench 3111. Thus, a gate electrode 210 formed of the liquid metal may be obtained at a low temperature. In other arrangements of the present disclosure, referring to FIG. 11, the liquid metal is filled in the second trench 3122 and the third trench 3123, to form a source electrode 220 and a drain electrode 230, respectively. The source electrode 220 and the drain electrode 230 have a height not greater than the depth of the second trench 3122 or the third trench 3123, and thus, the source electrode 220 and the drain electrode 230 formed of the liquid metal can be obtained at a low temperature.

S230: a second insulating layer is formed on a side of the electrode and the first insulating layer away from the substrate, In S230, a second insulating layer 320 is formed on a side of the electrode 200 and the first insulating layer 310 away from the substrate 100. In this way, the electrode 200 formed of the liquid metal can be sealed in the trench 3101, and a flat second insulating layer 320 can also be obtained. Besides, the product obtained in S230 may refer to FIG. 2.

According to an arrangement of the present disclosure, the surface of the second insulation layer 320 away from the first insulation layer 310 may be formed with a groove 301, and an orthogonal projection of a bottom wall of the groove 301 on the substrate 100 overlaps with an orthogonal projection of the electrode 200 on the substrate 100. The depth of the groove 301 does not exceed 200 nm. As such, since the height of the filled liquid metal in S220 does not exceed the depth of the trench 3101, the second insulating layer 320 will form a groove 301 with a depth not more than 200 nm at a position corresponding to the electrode 200, so that a second insulating layer 320 with a surface height difference not greater than 200 nm will be obtained.

Figure 3:
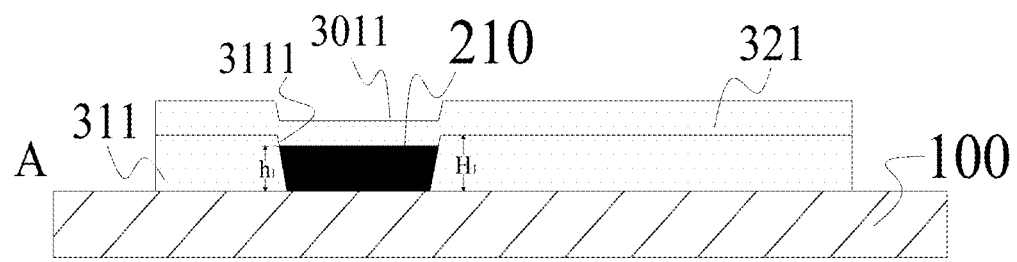
FIG. 3 is a cross-sectional schematic view of a display substrate according to another arrangement of the present disclosure.
Figure 4:
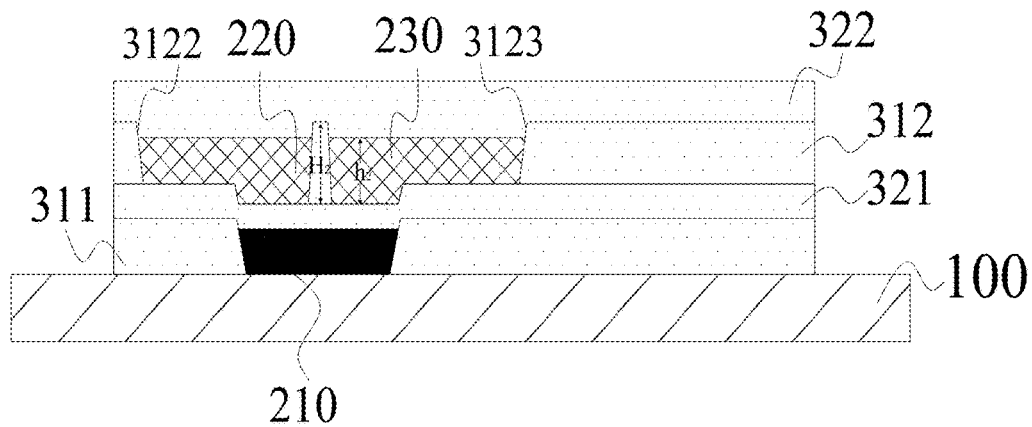
FIG. 4 is a cross-sectional schematic view of a display substrate according to another arrangement of the present disclosure.

In some arrangements of the present disclosure, referring to FIG. 3, a second insulating layer 321 is formed on a side of the gate electrode 210 and the first gate insulating layer 311 away from the substrate 100, and a surface of the second gate insulating layer 321 away from the gate electrode 210 is formed with the first groove 3011. In this way, a gate insulating layer structure with a surface height difference not more than 200 nm can be obtained, which is favorable for the flatness of the subsequently formed active layer, source/drain electrode layer, and protective layer. In other arrangements of the present disclosure, a second protective layer 322 is formed on a side of the source electrode 220 and the drain electrode 230 and first protective layer 312 away from the substrate 100, and a surface of the second protective layer 322 away from the first protective layer 312 is formed with a second groove. In this way, a protective layer structure having a surface height difference not more than 200 nm can be obtained. In some specific examples, referring to FIG. 12, the depth of the second groove may be 0 nm, so that a protective layer with a flatter upper surface may be obtained, therefore more conductive to the surface flatness of the thin film transistor structure.

According to an arrangement of the present disclosure, after S230, forming an active layer 400, a pixel electrode 500 or a common electrode 600 may be further included.

In some arrangements of the present disclosure, after the second gate insulating layer 321 shown in FIG. 3 is obtained, a layer of amorphous silicon material layer may be deposited on a side of the second gate insulating layer 321 away from the gate electrode 210, and then a patterned active layer 400 is formed by exposure using a mask, development and other processes. Then, an ITO material layer is further deposited and a patterned pixel electrode 500 is formed by exposure using a mask, etching, development and other processes. In this way, a display substrate with an improved structure can be obtained, and the product obtained refers to FIG. 9.

Figure 12:
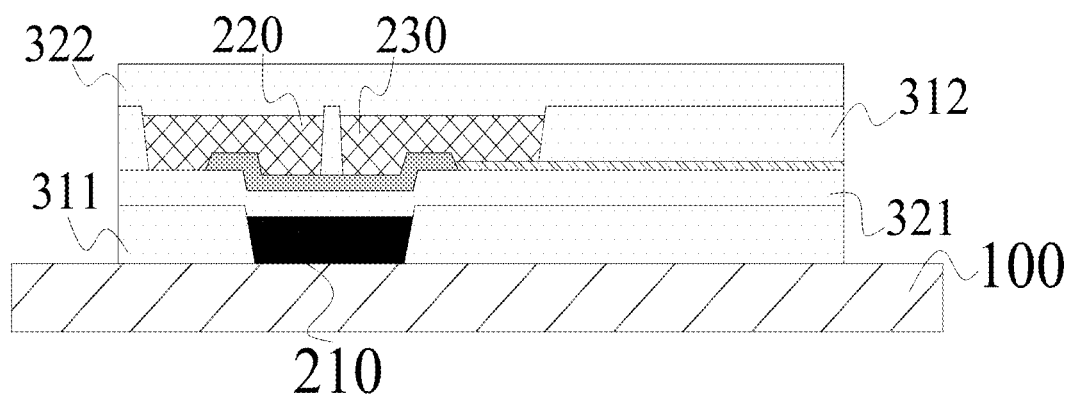
FIG. 12 is a schematic sectional view of a product of S230 of a manufacturing method according to another arrangement of the present disclosure.

In other arrangements of the present disclosure, after the second protective layer 322 shown in FIG. 12 is obtained, a layer of ITO material layer may be deposited on a side of the second protective layer 322 away from the first protective layer 312, and a patterned common electrode 600 may be formed by exposure using a mask, etching, developing and other processes. In this way, a display substrate with an improved structure can be obtained, and the product obtained refers to FIG. 5.

In summary, according to an arrangement of the present disclosure, the present disclosure provides a method of manufacturing a display substrate, in which a liquid metal is filled in the trench, and thus an electrode wiring having excellent flexibility and preventing fracturing may be obtained. Further, a low-temperature forming process of the electrode wiring may be realized, and then the production yield of the display substrate can be improved, and a display substrate having a film layer of excellent flatness and preventing fracturing can be obtained.

In some arrangements, the present disclosure provides a display panel. According to an arrangement of the present disclosure, the display panel includes the above display substrate.

According to arrangements of the present disclosure, the specific type of the display panel is not particularly limited, and specific examples thereof include a liquid crystal display (LCD) panel, etc., and a person skilled in the art may select correspondingly according to specific use requirements and actual use environment of the display panel, which will not be repeated herein.

It should be noted that, in addition to the display substrate, the display panel also includes other structures and compositions. The LCD display panel, which is taken as an example, may include a liquid crystal layer, a color filter substrate, and the like. Those skilled in the art can make corresponding supplement according to specific types of the display panel, which will not be repeated herein.

To sum up, according to an arrangement of the present disclosure, the present disclosure provides a display panel, it has a display substrate with good anti-fracturing and anti-faulting performance, so that the display panel is excellent in bending resistance. Those skilled in the art can understand that the features and advantages described above with respect to the display substrate are still applicable to the display panel, and will not be repeated herein.

In some arrangements, the present disclosure provides a display device. According to an arrangement of the present disclosure, the display device includes the above-mentioned display panel.

According to an arrangement of the present disclosure, the specific type of the display device is not particularly limited, and specific examples thereof include a liquid crystal display (LCD) device, or the like. A person skilled in the art can select correspondingly according to specific use requirements and actual use environment of the display device, which will not be repeated herein.

It should be noted that, in addition to the display panel, the display device also includes other structures and components, such as a housing, a control circuit board or a power line, etc., and those skilled in the art can make corresponding supplement according to specific types of the display device, which will not be repeated herein.

To sum up, according to an arrangement of the present disclosure, the present disclosure provides a display device, in which the display panel has excellent bending resistance performance, so that the flexible display effect of the display device is better. Those skilled in the art can understand that, the features and advantages described above with respect to the display substrate and the display panel are still applicable to the display device, which will not be repeated herein.

In the description of the present disclosure, it is to be understood that orientation or positional relationships indicated by terms "center", "longitudinal", "transverse", "length", "width", "thickness", "up", "down", "front", "rear", "left", "right", "vertical", "horizontal", "top", "bottom", "inner", "outer", "clockwise", "counterclockwise", "axial", "radial", "circumferential", etc. is based on orientation or positional relationships shown in the drawings, and is merely for convenience of describing the present disclosure and simplification of the description, and does not indicate or imply that the indicated device or element must have a particular orientation, be constructed and operated in a particular orientation, and therefore should not be construed to limit the present disclosure.

In the description of the present disclosure, the terms "mounting", "connecting", "connected", "fixing" and the like should be interpreted broadly, unless specifically defined and defined otherwise. For example, it can be fixed connection or may be detachable connection, or integrated into a whole; it can be mechanical connection or electrical connection; it can be direct connection, or it can be indirectly connected through the intermediary, it can be internal communication of two elements or interaction between two elements. Those of ordinary skill in the art can understand the specific meanings of the above terms in the present disclosure according to specific circumstances.

Furthermore, the terms "first" and "second" are used for descriptive purposes only, and are not to be construed as indicating or implying relative importance or implicitly indicating the number of indicated technical features. Thus, features defined as "first", "second" may explicitly or implicitly include at least one such feature. In the description of the present disclosure, the meaning of "plurality" is at least two, such as two, three, etc., unless specifically defined otherwise.

In the description of the present specification, the description of reference terms "one arrangement", "some arrangements", "an example", "a specific example", or "some examples" or the like means specific features, structures, materials, or features described in conjunction with the arrangement or example are included in at least one arrangement or example of the present disclosure. In this specification, the schematic representation of the above terms does not necessarily have to refer to the same arrangement or example. Furthermore, the particular features, structures, materials, or characteristics described may be combined in any suitable manner in any one or more of the arrangements or examples. In addition, those skilled in the art may combine and incorporate the different arrangements or examples described in this specification and features of different arrangements or examples without conflicting with each other.

Although the arrangements of the present disclosure have been shown and described above, it is to be understood that the above arrangements are exemplary and not to be construed as limiting the present disclosure, and that those skilled in the art may make variations, modifications, substitutions and variations to the above arrangements within the scope of the present disclosure.

What is claimed is:

1. A display substrate, comprising:
   a substrate; and
   a thin film transistor, provided on a first surface of the substrate and comprising an electrode and an insulating layer, the insulating layer covering the electrode,
   wherein a groove is formed on a surface of the insulating layer away from the electrode, and an orthogonal projection of a bottom wall of the groove on the substrate overlaps with an orthogonal projection of the electrode on the substrate, and
   wherein the insulating layer comprises:
   a first insulating layer, wherein a trench is provided on the first insulating layer, the electrode is provided in the trench, and the electrode has a height not greater than a depth of the trench, and
   a second insulating layer, provided on a side of the first insulating layer away from the substrate and covering the electrode and the first insulating layer, wherein the groove is formed on a surface of the second insulating layer away from the first insulating layer.

2. The display substrate according to claim 1, wherein the groove has a depth not exceeding 200 nm.

3. The display substrate according to claim 1, wherein the substrate is a flexible substrate.

4. The display substrate according to claim 1, wherein the electrode has a material comprising a liquid metal.

5. The display substrate according to claim 4, wherein the liquid metal comprises at least one selected from a copper aluminum alloy, a copper silver alloy, a gallium indium tin alloy and an indium bismuth alloy.

6. The display substrate according to claim 1, wherein
   the electrode is a gate electrode provided on the first surface of the substrate;
   the insulating layer is a gate insulating layer comprising: a first gate insulating layer and a second gate insulating layer;
   the first insulating layer is the first gate insulating layer, provided on the first surface of the substrate and having the trench, wherein the gate electrode is provided in the trench, and the gate electrode has a height not greater than the depth of the groove; and
   the second insulating layer is the second gate insulating layer, covering the gate electrode and the first gate insulating layer, wherein the groove is formed on a surface of the second gate insulating layer away from the first gate insulating layer.

7. The display substrate according to claim 1, wherein
   the electrode is a source electrode and a drain electrode;
   the insulating layer is a protective layer comprising: a first protective layer, and a second protective layer;
   the first insulating layer is the first protective layer, and the trench consists of a first trench and a second trench, wherein a spacer is provided between the first trench and the second trench, the source electrode is provided in the first trench, the drain electrode is provided in the second trench, and the source electrode has a height not greater than a depth of the first trench, and the drain electrode has a height not greater than a depth of the second trench; and
   the second insulating layer is the second protective layer, covering the source electrode, the drain electrode and the first protective layer, wherein the groove is formed on a surface of the second protective layer away from the first protective layer.

8. A method of manufacturing a display substrate, comprising:
   providing a substrate; and
   forming a thin film transistor on a first surface of the substrate, the thin film transistor comprising an electrode and an insulating layer, and the insulating layer covering the electrode;
   wherein a groove is formed on a surface of the insulating layer away from the electrode, and an orthogonal projection of a bottom wall of the groove on the substrate overlaps with an orthogonal projection of the electrode on the substrate, and
   wherein forming the thin film transistor further comprises:
   forming a first gate insulating layer on the first surface of the substrate, wherein a first trench is formed on the first gate insulating layer;
   filling a liquid metal in the first trench to form a gate electrode, wherein the gate electrode has a height not greater than a depth of the first trench; and
   forming a second gate insulating layer on a side of the gate electrode and the first gate insulating layer away from the substrate, wherein the groove is formed on a surface of the second gate insulating layer away from the first gate insulating layer.

9. The method according to claim 8, the groove has a depth not exceeding 200 nm.

10. The method according to claim 8, wherein the electrode has a material comprising a liquid metal, the liquid metal has a filling level not greater than a depth of the trench.

11. The method according to claim 8, wherein forming the thin film transistor further comprises:
    forming a first protective layer, wherein a second trench and a third trench provided with a spacer therebetween are formed on the first protective layer;
    filling a liquid metal in the second trench and the third trench to form a source electrode and a drain electrode respectively, wherein the source electrode and the drain electrode have heights not greater than depths of the second trench and the third trench respectively; and
    forming a second protective layer on a side of the source electrode, the drain electrode and the first protective layer away from the substrate, wherein the groove is formed on a surface of the second protective layer away from the first protective layer.

12. A display panel, comprising:
a display substrate, wherein the display substrate comprises:
   a substrate; and
   a thin film transistor, provided on a first surface of the substrate and comprising an electrode and an insulating layer, the insulating layer covering the electrode,
   wherein a groove is formed on a surface of the insulating layer away from the electrode, and an orthogonal projection of a bottom wall of the groove on the substrate overlaps with an orthogonal projection of the electrode on the substrate, and
wherein the insulating layer comprises:
a first insulating layer, wherein a trench is provided on the first insulating layer, the electrode is provided in the trench, and the electrode has a height not greater than a depth of the trench; and
a second insulating layer, provided on a side of the first insulating layer away from the substrate and covering the electrode and the first insulating layer, wherein the groove is formed on a surface of the second insulating layer away from the first insulating layer.

13. A display device, comprising:
a display panel, wherein the display panel comprises:
   a display substrate, wherein the display substrate comprises:
      a substrate; and
      a thin film transistor, provided on a first surface of the substrate and comprising an electrode and an insulating layer, the insulating layer covering the electrode,
      wherein a groove is formed on a surface of the insulating layer away from the electrode, and an orthogonal projection of a bottom wall of the groove on the substrate overlaps with an orthogonal projection of the electrode on the substrate, and
wherein the insulating layer comprises:
a first insulating layer, wherein a trench is provided on the first insulating layer, the electrode is provided in the trench, and the electrode has a height not greater than a depth of the trench; and
a second insulating layer, provided on a side of the first insulating layer away from the substrate and covering the electrode and the first insulating layer, wherein the groove is formed on a surface of the second insulating layer away from the first insulating layer.

* * * * *